US012796495B2

(12) United States Patent
Oh et al.

(10) Patent No.: US 12,796,495 B2
(45) Date of Patent: Nov. 10, 2026

(54) SEMICONDUCTOR PACKAGE

(71) Applicant: SAMSUNG ELECTRONICS CO., LTD., Suwon-si (KR)

(72) Inventors: Seungryong Oh, Suwon-si (KR); Seunghoon Yeon, Suwon-si (KR); Junho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 414 days.

(21) Appl. No.: 18/421,440

(22) Filed: Jan. 24, 2024

(65) Prior Publication Data

US 2024/0258224 A1 Aug. 1, 2024

(30) Foreign Application Priority Data

Jan. 27, 2023 (KR) ........................ 10-2023-0011109

(51) Int. Cl.

| | |
|---|---|
| ***H10W 70/63*** | (2026.01) |
| ***H10W 70/65*** | (2026.01) |
| ***H10W 74/10*** | (2026.01) |
| ***H10W 90/00*** | (2026.01) |
| ***H10W 90/20*** | (2026.01) |

(52) U.S. Cl.

CPC ......... *H10W 70/635* (2026.01); *H10W 70/65* (2026.01); *H10W 74/114* (2026.01); *H10W 74/137* (2026.01); *H10W 90/00* (2026.01); *H10W 90/297* (2026.01); *H10W 90/792* (2026.01)

(58) Field of Classification Search

CPC ............. H10W 70/365; H10W 90/297; H10W 90/792; H10W 70/65

See application file for complete search history.

(56) References Cited

U.S. PATENT DOCUMENTS

| | | | |
|---|---|---|---|
| 8,952,543 | B2 | 2/2015 | Lee et al. |
| 9,716,066 | B2 | 7/2017 | Lee et al. |
| 10,833,052 | B2 | 11/2020 | Shih |
| 11,387,222 | B2 | 7/2022 | Yu et al. |

(Continued)

FOREIGN PATENT DOCUMENTS

| | | | |
|---|---|---|---|
| CN | 114464597 | A | 5/2022 |
| KR | 10-2101377 | B1 | 4/2020 |

*Primary Examiner* — Christine S. Kim
*Assistant Examiner* — Emily Farmer
(74) *Attorney, Agent, or Firm* — Sughrue Mion, PLLC

(57) ABSTRACT

A semiconductor package includes a package-bottom redistribution structure at a lower side of a package and including a conductive line, an upper semiconductor chip at an upper side of the package, an upper back end of line (BEOL) layer, at a lower side of the upper semiconductor chip, and including a conductive line, a lower semiconductor chip below the upper semiconductor chip, where a horizontal width of the lower semiconductor chip is less than a horizontal width of the upper semiconductor chip, and where the upper semiconductor chip overlaps at least a portion of the lower semiconductor chip, a lower BEOL layer at a lower side of the lower semiconductor chip and including a conductive line, a passivation layer on an upper surface of the lower semiconductor chip, and a through silicon via (TSV) structure penetrating the passivation layer and the lower semiconductor chip.

13 Claims, 14 Drawing Sheets

(56) References Cited

U.S. PATENT DOCUMENTS

| | | | | |
|---|---|---|---|---|
| 2015/0194455 | A1* | 7/2015 | Ho | H10F 39/018 438/109 |
| 2021/0118858 | A1* | 4/2021 | Yu | H10W 70/09 |
| 2022/0139880 | A1 | 5/2022 | Lee et al. | |

* cited by examiner

SEMICONDUCTOR PACKAGE

CROSS-REFERENCE TO RELATED APPLICATION

This application is based on and claims priority to Korean Patent Application No. 10-2023-0011109, filed on Jan. 27, 2023, in the Korean Intellectual Property Office, the disclosure of which is incorporated herein by reference in its entirety.

BACKGROUND

1. Field

Example embodiments of the present disclosure relate to a semiconductor package, and more particularly to a semiconductor package including a plurality of semiconductor chips.

2. Description of Related Art

According to rapid development and user demands, electronic products are becoming more miniaturized and lighter. In order to achieve miniaturization and light weight, the volume of semiconductor packages mounted on the electronic products is gradually decreasing.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a semiconductor package including a plurality of semiconductor chips with reduced vertical height.

One or more example embodiments also provide a semiconductor package including a plurality of semiconductor chips with improved connection reliability.

Additional aspects will be set forth in part in the description which follows and, in part, will be apparent from the description, or may be learned by practice of the presented embodiments.

According to an aspect of an example embodiment, a semiconductor package may include a package-bottom redistribution structure at a lower side of a package and including a conductive line, an upper semiconductor chip at an upper side of the package, an upper back end of line (BEOL) layer, at a lower side of the upper semiconductor chip, and including a conductive line, a lower semiconductor chip below the upper semiconductor chip, where a horizontal width of the lower semiconductor chip is less than a horizontal width of the upper semiconductor chip, and where at least a portion of the upper semiconductor chip overlaps the lower semiconductor chip, a lower BEOL layer at a lower side of the lower semiconductor chip and including a conductive line, a passivation layer on an upper surface of the lower semiconductor chip, a through silicon via (TSV) structure penetrating the passivation layer and the lower semiconductor chip, the TSV structure being connected to the conductive line of the lower BEOL layer, a first redistribution line connected to the TSV structure, where at least a portion of the first redistribution line is impregnated in the passivation layer, a second redistribution line above the first redistribution line and connected to the first redistribution line through an intermediate via, a first intermediate insulating layer on the passivation layer, separating the first redistribution line from the second redistribution line and at least partially surrounding the intermediate via, a second intermediate insulating layer on the first intermediate insulating layer and at least partially surrounding the second redistribution line, an inter-chip connection structure between the second intermediate insulating layer and the upper BEOL layer, the inter-chip connection structure connecting the conductive line of the upper BEOL layer and the second redistribution line, a first post connecting the conductive line of the lower BEOL layer and the conductive line of the package-bottom redistribution structure, a second post connecting the conductive line of the upper BEOL layer and the conductive line of the package-bottom redistribution structure, a first molding layer between the lower BEOL layer and the package-bottom redistribution structure, the first molding layer at least partially surrounding the first post and a second molding layer between the upper BEOL layer and the package-bottom redistribution structure, the second molding layer at least partially surrounding the second post.

According to an aspect of an example embodiment, a semiconductor package may include a lower semiconductor chip at a lower side of a package, a lower BEOL layer, at a lower side of the lower semiconductor chip, and including a conductive line, an upper semiconductor chip above the lower semiconductor chip, where a horizontal width of the upper semiconductor chip is less than a horizontal width of the lower semiconductor chip, and where the upper semiconductor chip overlaps at least a portion of the lower semiconductor chip, an upper BEOL layer at a lower side of the upper semiconductor chip and including a conductive line, a passivation layer on an upper surface of the lower semiconductor chip, a TSV structure penetrating the passivation layer and the lower semiconductor chip, the TSV structure being connected to the conductive line of the lower BEOL layer, a first redistribution line connected to the TSV structure, where at least a portion of the first redistribution line is impregnated in the passivation layer, a second redistribution line above the first redistribution line and connected to the first redistribution line through an intermediate via, a first intermediate insulating layer on the passivation layer, separating the first redistribution line from the second redistribution line and at least partially surrounding the intermediate via, a second intermediate insulating layer on the first intermediate insulating layer and at least partially surrounding the second redistribution line, an inter-chip connection structure between the second intermediate insulating layer and the upper BEOL layer, the inter-chip connection structure connecting the conductive line of the upper BEOL layer to the second redistribution line, and a molding layer above the lower semiconductor chip and at least partially surrounding the upper semiconductor chip.

According to an aspect of an example embodiment, a semiconductor package may include a semiconductor chip, a BEOL layer, at a lower side of the semiconductor chip, and including a conductive line, a passivation layer on an upper surface of the semiconductor chip, a TSV structure penetrating the passivation layer and the semiconductor chip, the TSV structure being electrically connected to the conductive line of the BEOL layer, a first redistribution line connected to the TSV structure, where at least a portion of the first redistribution line is impregnated in the passivation layer, a second redistribution line above the first redistribution line and connected to the first redistribution line through an intermediate via, a first intermediate insulating layer on the passivation layer, separating the first redistribution line from the second redistribution line and at least partially surrounding the intermediate via, and a second intermediate insulating layer on the first intermediate insulating layer and at least partially surrounding the second redistribution line.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
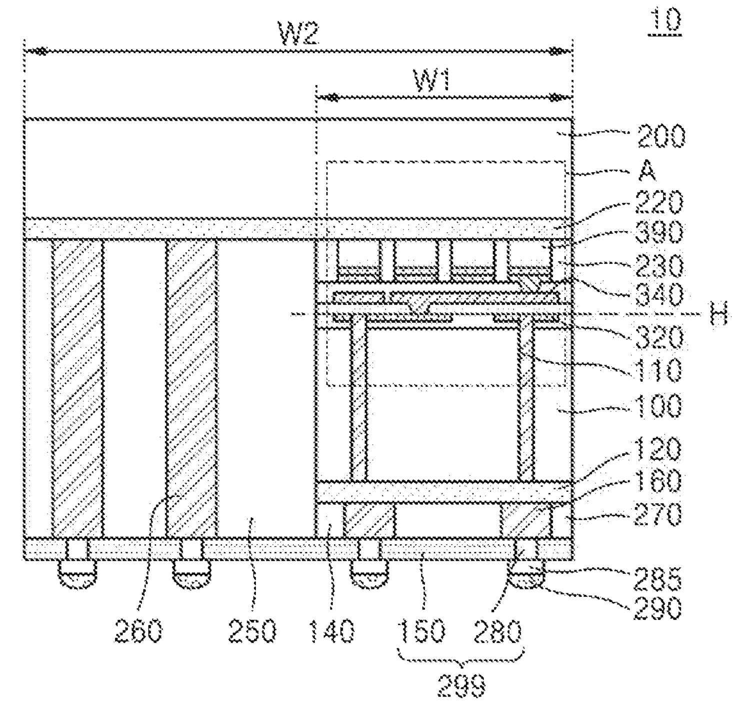
FIG. 1 is a cross-sectional view of a semiconductor package according to example embodiments of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c FIG. 1 is a cross-sectional view of a semiconductor package according to example embodiments of the present disclosure.

Referring to FIG. 1, the semiconductor package 10 may include a lower semiconductor chip 100 and an upper semiconductor chip 200 vertically stacked, and the semiconductor package 10 may have a "large top" shape, in which the horizontal area (e.g., a horizontal width, a cross-sectional area or an area in a cross-sectional view) of the lower semiconductor chip 100 is less than that of the upper semiconductor chip 200. That is, the width W1 of the lower semiconductor chip 100 may be less than an overall width W2 of the upper semiconductor chip 200. In such examples, the lower semiconductor chip 100 may be disposed below the upper semiconductor chip 200, and the width of the lower semiconductor chip 100 may be less than that of the upper semiconductor chip 200, such that at least a portion of the upper semiconductor chip 200 at least partially overlaps the lower semiconductor chip 100. That is, the cross-sectional area of the lower semiconductor chip 100 may be less than the cross-sectional area of the upper semiconductor chip 200.

In FIG. 1, the lower semiconductor chip 100 is shown, but the lower semiconductor chip 100 may include a lower semiconductor substrate having an active surface and an inactive surface opposite to each other, and lower semiconductor devices formed on the active surface of the lower semiconductor substrate. The inactive surface of the lower semiconductor substrate may be an upper surface of the lower semiconductor chip 100.

The lower semiconductor substrate constituting a portion of the lower semiconductor chip 100 may include a semiconductor material such as silicone (Si) or germanium (Ge). Alternatively, the lower semiconductor substrate may include a semiconductor material compound such as SiC, GaAs, InAs, and InP. The lower semiconductor substrate may include a conductive area (e.g., an area doped with impurities). The lower semiconductor substrate may have a variety of device isolation structures, such as a shallow trench isolation (STI) structure.

The lower semiconductor device including a plurality of individual devices may be formed on the active surface of the lower semiconductor substrate. The plurality of individual devices may include a variety of microelectronic devices, such as a metal-oxide-semiconductor field-effect transistor (MOSFET) (e.g., complementary MOS (CMOS) transistor etc.), a system large scale integration (LSI), an active device, a passive device, and the like. The plurality of individual devices may be electrically connected to conductive regions of the lower semiconductor substrate. The lower semiconductor device may further include a conductive interconnection or a conductive plug that electrically connects at least two of the plurality of individual devices, or connects the plurality of individual devices to the conductive region of the lower semiconductor substrate. In addition, each of the plurality of individual devices may be electrically isolated from neighboring other individual devices by an insulating layer.

In some embodiments, the lower semiconductor device may be a memory semiconductor device, and the lower semiconductor chip 100 may be a memory semiconductor chip. For example, the lower semiconductor device may be a dynamic random access memory (DRAM) device, and the lower semiconductor chip 100 may be a DRAM chip. In other embodiments, the lower semiconductor chip 100 may be a logic chip.

A lower back end of line (BEOL) layer 120 may be disposed at the lower side of the lower semiconductor chip 100. The lower BEOL layer 120 may include interconnection lines and interconnection vias, which are conductive lines between the active surface of the lower semiconductor substrate and the lower surface of the lower semiconductor chip 100, and an inter-interconnection insulating layer surrounding or at least partially surrounding the interconnection lines and interconnection vias.

The interconnection lines and the interconnection vias included in the lower BEOL layer 120 may include, for example, a metal material such as aluminum, copper or tungsten. In some embodiments, the interconnection lines and the interconnection vias may include a barrier film and a metal layer for interconnection. The barrier film for interconnection may include a nitride or oxide of metal such as Ti, Ta, Ru, Mn, CO, or W, or may include an alloy such as CoWP, CoWB, or CoWBP. The metal layer for interconnection may include at least one metal selected from W, Al, Ti, Ta, Ru, Mn, or Cu. The inter-interconnection insulating layer may include a silicon oxide, for example. In some embodiments, the inter-interconnection insulating layer may include tetraethyl orthosilicate (TEOS). In some other embodiments, the inter-interconnection insulating layer may include an insulating material having a lower dielectric constant than the silicon oxide. For example, the inter-interconnection insulating layer may include an ultra-low K (ULK) film having an ultra-low dielectric constant K of about 2.2 to about 2.4. The ULK film may include a SiOC film or a SiCOH film.

In a lower side of the lower BEOL layer 120, a plurality of lower semiconductor chip pads that are electrically connected to the conductive lines in the lower BEOL layer 120 may be disposed.

On the other hand, the lower semiconductor chip 100 is formed with a plurality of through-silicon via (TSV) structures, such as TSV structure 110. In general, the TSV structure may be a structure for electrical connection vertically through a substrate or a die in a three-dimensional (3D) package in which a plurality of semiconductor chips are mounted in one semiconductor package. The TSV structure 110 may vertically penetrate the lower semiconductor chip 100, and an upper end of the TSV structure 110 may extend to protrude into a passivation layer 310 (see FIG. 3A) that is formed on the upper surface of the lower semiconductor chip 100, and a lower end of the TSV structure 110 may be electrically connected to the conductive line included in the lower BEOL layer 120.

The TSV structure 110 may include a conductive plug that penetrates the lower semiconductor chip 100 and a conductive barrier film that surrounds or at least partially surrounds the conductive plug. The conductive plug may have a circle pillar shape, and the conductive barrier film may have a cylinder shape that surrounds or at least partially surrounds a side wall of the conductive plug.

The conductive plug of the TSV structure 110 may include Cu, CuSn, CuMg, CuNi, CuZn, CuPd, CuAu, CuRe, CuW, W, or W alloy, but is not limited thereto. The conductive plug may include one or more of Al, Au, Be, Bi, Co, Cu, Hf, In, Mn, Mo, Ni, Pb, Pd, Pt, Rh, Re, Ru, Ta, Te, Ti, W, Zn, and Zr, and may include one or more stacked structure thereof, but is not limited thereto. The conductive barrier film may include at least one material of W, WN, WC, Ti, TiN, Ta, TaN, Ru, Co, Mn, WN, Ni, or NiB, but is not limited thereto. The conductive barrier film and the conductive plug may be formed by a physical vapor deposition (PVD) process or a chemical vapor deposition (CVD) process, but are not limited thereto.

On the other hand, a plurality of first posts 160 may be formed on the lower side of the lower BEOL layer 120 to be spaced from each other. An upper end of the first post 160 may be electrically connected to the conductive line in the lower BEOL layer 120, and a lower end of the first post 160 may be electrically connected to a conductive line 280 of a package-bottom lower redistribution structure 299 which is disposed at a lower side of the semiconductor package 10. The package-bottom lower redistribution structure 299 may include the conductive line 280 and an inter-interconnection insulating layer 150. The upper end of the first post 160 and the conductive line in the lower BEOL layer 120 may be electrically connected through a conductive pad, and the lower end of the first post 160 and the conductive line 280 of the package-bottom redistribution structure 299 may also be electrically connected through a conductive pad. The plurality of first posts 160 may be surrounded or at least partially surrounded by a first molding layer 270. In some embodiments, each of the plurality of first posts 160 may have a cylinder shape or a polygonal shape such as a square column.

The first molding layer 270 may surround or at least partially surround the first posts 160 between the lower BEOL layer 120, and the conductive line 280 of the package-bottom redistribution structure 299 and an inter-interconnection insulating layer 150 of the package-bottom redistribution structure 299. The first molding layer 270 may include, for example, an epoxy mold compound (EMC). The package-bottom redistribution structure 299 may include the conductive lines 280, the inter-interconnection insulating layer 150 surrounding or at least partially surrounding and insulating the conductive lines 280 from each other, and package-bottom pads 285.

Again, although the upper semiconductor chip 200 is schematically shown in FIG. 1, the upper semiconductor chip 200 may include an upper semiconductor substrate having an active surface and an inactive surface opposite to each other, and upper semiconductor devices formed on the active surface of the upper semiconductor substrate. The inactive surface of the upper semiconductor substrate may be an upper surface of the upper semiconductor chip 200.

The upper semiconductor substrate and the upper semiconductor devices constituting the upper semiconductor chip 200 may be configured to be the same as to or similar to the lower semiconductor substrate and the lower semiconductor devices constituting the lower semiconductor chip 100. The upper semiconductor device may further include a conductive interconnection or a conductive plug that electrically connects at least two of a plurality of individual devices, or connects at least one of the plurality of individual devices to a conductive region of the lower semiconductor substrate. In some embodiments, the upper semiconductor device may be a memory semiconductor device, and the upper semiconductor chip 200 may be a memory semiconductor chip. For example, the upper semiconductor device may be a DRAM device, and the upper semiconductor chip 200 may be a DRAM chip. In other embodiments, the upper semiconductor chip 200 may be a logic chip.

The upper BEOL layer 220 may be disposed at a lower side of the upper semiconductor chip 200. The upper BEOL layer 220 may include interconnection lines and interconnection vias, which constitute conductive lines between the active surface of the upper semiconductor substrate and a lower surface of the upper semiconductor chip 200, and an inter-interconnection surrounding or at least partially surrounding the interconnection lines and interconnection vias.

The interconnection lines and the interconnection vias included in the upper BEOL layer 220 may include, for example, a metal material such as aluminum, copper or tungsten. In addition, as in the lower BEOL layer 120 described above, the interconnection lines and the interconnection vias included in the upper BEOL layer 220 may include a barrier film for interconnection and a metal layer for interconnection. In a lower side of the upper BEOL layer 220, a plurality of upper semiconductor chip pads that are electrically connected to the conductive lines in the upper BEOL layer 220 may be disposed.

On the other hand, a plurality of second posts 260 may be formed on the lower side of the upper BEOL layer 220 to be spaced from each other. An upper end of the second post 260 may be electrically connected to the conductive line in the upper BEOL layer 220, and a lower end of the second post 260 may be electrically connected to the conductive line 280 of the package-bottom redistribution structure 299, which is disposed at the lower side of the semiconductor package 10. The upper end of the second post 260 and the conductive line in the upper BEOL layer 220 may be electrically connected through a conductive pad, and the lower end of the second post 260 and the conductive line 280 of the package-bottom redistribution structure 299 may also be electrically connected through a conductive pad. The plurality of second posts 260 may be surrounded or at least partially surrounded by a second molding layer 250. In some embodiments, each of the plurality of second posts 260 may have a cylinder shape or a polygonal shape such as a square column.

The second molding layer 250 may surround or at least partially surround the second posts 260 between the upper BEOL layer 220, and the conductive line 280 of the package-bottom redistribution structure 299 and the inter-interconnection insulating layer 150 of the package-bottom redistribution structure 299. In addition, the second molding layer 250 may contact side walls of the first molding layer 140 and the lower semiconductor chip 100. The second molding layer 250 may include, for example, an EMC.

On the other hand, the package-bottom redistribution structure 299 disposed at the bottom of the semiconductor package 10 may include the conductive lines 280, the inter-interconnection insulating layer 150 insulating and surrounding or at least partially surrounding the conductive lines 280, and the package-bottom pads 285. The conductive lines 280 may include vertically and horizontally a plurality of redistribution lines and a plurality of redistribution vias, and the plurality of redistribution lines and the plurality of redistribution vias may be electrically insulated by the inter-interconnection insulating layer 150.

In some embodiments, a plurality of the inter-interconnection insulating layer 150 of the package-bottom redistribution structure 299 may be stacked. The inter-interconnection insulating layer 150 may include, for example, photo imageable dielectric (PID) or photosensitive polyimide (PSPI). The conductive line 280 of the package-bottom redistribution structure 299 may include a metal, such as copper (Cu), aluminum (Al), tungsten (W), titanium (Ti), tantalium (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but it is not limited thereto. In some embodiments, the conductive line 280 of the package-bottom redistribution structure 299 may be formed by stacking metals or alloys thereof on a seed layer including titanium, titanium nitride, or titanium tungsten.

The redistribution line and the redistribution via that constitutes the conductive line 280 of the package-bottom redistribution structure 299 may be formed together to form an integral body. In some embodiments, the redistribution via may have a tapered shape extending from a lower side to an upper side while a horizontal width thereof narrows.

On the other hand, the conductive line 280 of the package-bottom redistribution structure 299 may be electrically connected to the package-bottom pad 285, and a plurality of package connection terminals 290 may be attached to the package-bottom pad 285. For example, the package connection terminal 290 may include a solder ball, or a solder bump.

On the other hand, in order to electrically connect the lower semiconductor chip 100 and the upper semiconductor chip 200, a first redistribution line 320 and a second redistribution line 340 may be formed on an upper side of the lower semiconductor chip 100, and an inter-chip connection structure for connecting the second redistribution line 340 to the conductive line of the upper BEOL layer 220 may be disposed. The inter-chip connection structure will be described in detail with reference to FIG. 3A.

Figure 2:
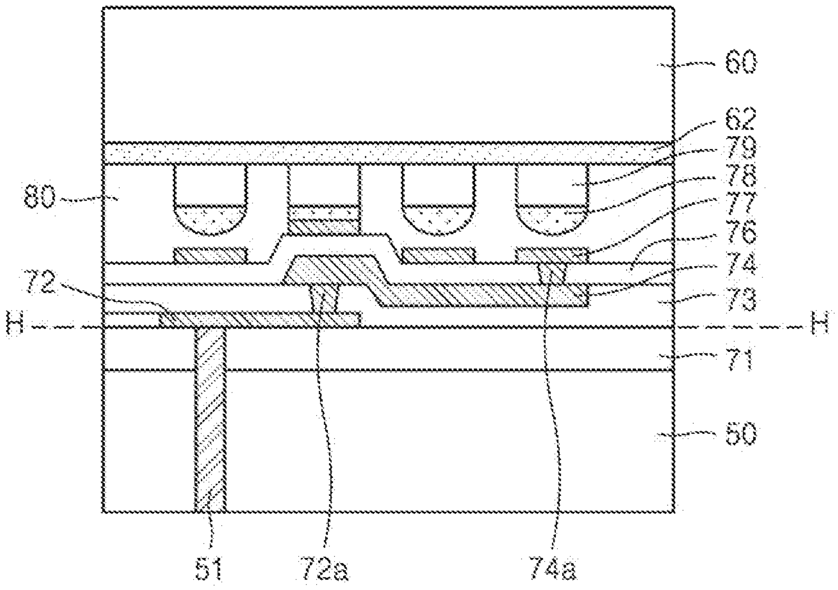
FIG. 2 is a cross-sectional view of a semiconductor package.

FIG. 2 is a cross-sectional view of a semiconductor package corresponding to section A of FIG. 1 and according to related art. For the convenience of explanation, in FIG. 2, only the left TSV structure 51 is shown among the two TSV structures shown in the 'A' part of FIG. 1.

Referring to FIG. 2, a 2-redistribution line (2-RDL) structure may be applied to an upper surface of a lower semiconductor chip 50. That is, the 2-RDL structure including a first redistribution line 72 and a second redistribution line 74 may be applied to the upper surface of the lower semiconductor chip 50. A passivation layer 71 may be formed on the upper surface of the lower semiconductor chip 50 at a predetermined thickness. The TSV structure 51 penetrating the lower semiconductor chip 50 may extend while protruding into the first passivation layer 71 at a predetermined height. The first redistribution line 72 may be formed on the passivation layer 71 at a predetermined thickness. A lower surface of the first redistribution line 72 may contact an upper end of the TSV structure 51.

A first intermediate insulating layer 73 may be formed on the first passivation layer 71 and the first redistribution line 72, and a second redistribution line 74 may be formed on the first intermediate insulating layer 73. A second intermediate insulating layer 76 covering the second redistribution line 74 may be formed on the first intermediate insulating layer 73. The first redistribution line 72 may be electrically connected to the second redistribution line 74 with a first intermediate via 72*a* therebetween. The second redistribution line 74 may be electrically connected to an upper pad 77 of the lower semiconductor chip 50, which is formed on the second intermediate insulating layer 760, through a second intermediate via 74*a* formed in the second intermediate insulating layer 76.

Referring again to FIG. 2, the lower semiconductor chip 50 may be electrically connected to an upper semiconductor chip 60 through an inter-chip connection structure therebetween. The inter-chip connection structure may include a lower pad 79 that is formed on a lower surface of the upper BEOL layer 62 and is electrically connected to a conductive line of the upper BEOL layer 62, and a connection terminal 78 connected to a lower side of the upper pad 77. The lower pad 79 and the connection terminal 78 constituting the inter-chip connection structure may be surrounded or at least partially surrounded by a third molding layer 80. The third molding layer 80 may include EMC. When the connection terminal 78 contacts the upper pad 77 of the lower semiconductor chip 50, the lower semiconductor chip 50 and the upper semiconductor chip 60 may be electrically connected to each other.

Figure 3A:
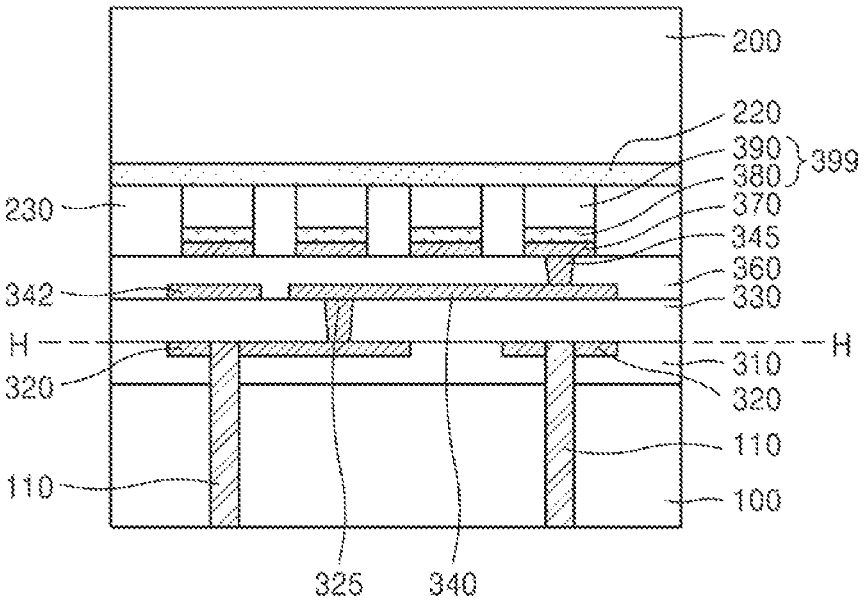
FIGS. 3A, 3B, 3C and 3D are cross-sectional views of semiconductor packages according to example embodiments of the present disclosure.

FIGS. 3A, 3B, 3C and 3D are cross-sectional views of semiconductor packages corresponding to section A of FIG. 1 according to example embodiments of the present disclosure. FIG. 3A depicts an example of components that may correspond to section "A" of FIG. 1.

FIG. 3A shows an example in which a 2-RDL structure may be provided on the upper surface of the lower semiconductor chip 100 to accommodate the customer's request for improvement in design freedom in a backside process of the lower semiconductor chip 100. That is, FIG. 3A shows that the upper surface of the lower semiconductor chip 100 may be applied with the 2-RDL structure including the first redistribution line 320 and the second redistribution line 340.

Referring to FIG. 3A, a first passivation layer 310 may be formed on the upper surface of the lower semiconductor chip 100 with a predetermined thickness. The first passivation layer 310 may be formed as an insulating material to insulate the first redistribution line 320 disposed thereon from the upper surface of the lower semiconductor chip 100 while protecting the upper surface of the lower semiconductor chip 100. The first passivation layer 310 may include, but is not limited thereto, oxide, nitride, or oxynitride. The upper surface of the lower semiconductor chip 100 may be, for example, the inactive surface of the lower semiconductor substrate in the lower semiconductor chip 100. In FIG. 3A, for the convenience of description, an embodiment in which the first passivation layer 310 is made of a single layer is shown, but in other embodiments, a plurality of insulating material layers such as a second passivation layer 312 (see FIGS. 7C to 7M, and 8B) may be further formed on the first passivation layer 310.

On the other hand, the TSV structure 110 penetrating the lower semiconductor chip 100 may extend while protruding into the first passivation layer 310 at a predetermined height. The first redistribution line 320 may be impregnated in the first passivation layer 310. In the embodiment of FIG. 3A, the first redistribution line 320 may be formed to be impregnated in the first passivation layer 310 such that an upper surface of the first redistribution line 320 is vertically coplanar with an exposed interface H of the upper end of the TSV structure 110.

A first intermediate insulating layer 330 may be formed on the first passivation layer 310 and the first redistribution line 320, and a second redistribution line 340 may be formed on the first intermediate insulating layer 330. A second intermediate insulating layer 360 covering the second redistribution line 340 may be formed on the first intermediate insulating layer 330. The first redistribution line 320 may be electrically connected to the second redistribution line 340 with a first intermediate via 325 therebetween. The second redistribution line 340 may be electrically connected to an upper pad 370 of the lower semiconductor chip 100, which may be formed on the second intermediate insulating layer 360, through a second intermediate via 345 formed in the second intermediate insulating layer 360.

The components of the lower semiconductor chip 100, including the first redistribution line 320, the first intermediate insulating layer 330, the second redistribution line 340, the second intermediate insulating layer 360, the first intermediate via 325, and the second intermediate via 345 may be refer to as an upper redistribution structure. The first redistribution line 320, the second redistribution line 340, the first intermediate via 325, and the second intermediate via 345 may include a conductive material (e.g., a metal such as Cu, Al, W, Ti, Ta, In, Mo, Mn, Co, Sn, Ni, Mg, Re, Be, Ga, Ru, etc., or alloys thereof), but are not limited thereto. In some embodiments, the conductive line 280 of a package-bottom redistribution structure (e.g., the package-bottom redistribution structure 299) may be formed by stacking metals or alloys thereof on a seed layer including titanium, titanium nitride, or titanium tungsten.

In some embodiments, the first redistribution line 320, the second redistribution line 340, the first intermediate via 325, and the second intermediate via 345 may include a barrier film for interconnection and a metal layer for interconnection. The barrier film for interconnection may include nitride or oxide of metal such as Ti, Ta, Ru, Mn, Co, or W, or may include alloy such as CoWP, CoWB, or CoWBP. The metal layer for interconnection may include at least one metal selected from W, Al, Ti, Ta, Ru, Mn, or Cu.

On the other hand, the first intermediate insulating layer 330 and the second intermediate insulating layer 360 may include, for example, PID or PSPI. In some embodiments, the first intermediate insulating layer 330 and the second intermediate insulating layer 360 may include silicon oxide. In some embodiments, the first intermediate insulating layer 330 and the second intermediate insulating layer 360 may include TEOS. In some other embodiments, the first intermediate insulating layer 330 and the second intermediate insulating layer 360 may include an insulating material having a lower dielectric constant than the silicon oxide. For example, the first intermediate insulating layer 330 and the second intermediate insulating layer 360 may include ULK film having an ultra-low dielectric constant K of about 2.2 to 2.4. The ULK film may include a SiOC film or a SiCOH film.

In some embodiments, the first redistribution line 320, the second redistribution line 340, the first intermediate via 325, and the second intermediate via 345 may include the same conductive material or may include different conductive materials. In addition, the first intermediate insulating layer 330 and the second intermediate insulating layer 360 may include the same insulating material or may include different insulating materials.

Referring again to FIG. 3A, the first passivation layer 310 may have a thickness of about 0.1 μm to about 10 μm, and in some embodiments, about 0.5 μm to about 5 μm. The first redistribution line 320 and the second redistribution line 340 may have a thickness of about 0.1 μm to about 10 μm, an in some embodiments, about 0.5 μm to about 5 μm. In addition, the first redistribution line 320 and the second redistribution line 340 may have the same thickness and may have different thicknesses. In addition, the upper pad 370 of the lower semiconductor chip 100 may have a thickness of about 0.5 μm to about 10 μm, and in some embodiments, about 1 μm to about 5 μm.

On the other hand, the first intermediate insulating layer 330 and the second intermediate insulating layer 360 may be formed to a thickness that may maintain sufficient insulation characteristics between the first redistribution line 320 and the second redistribution line 340 and between the second redistribution line 340 and the upper pad 370, respectively.

In FIG. 3A, planar shapes of the first redistribution line 320, the second redistribution line 340, and the upper pad 370 will be described with reference to FIGS. 6A to 6C.

Referring to FIG. 3A, the lower semiconductor chip 100 may be electrically connected to the upper semiconductor chip 200 through the inter-chip connection structure 399 therebetween. The inter-chip connection structure 399 may include a lower pad 390 that is formed on a lower surface of the upper BEOL layer 220 and is electrically connected to the conductive line of the upper BEOL layer 220, and a connection terminal 380 connected to a lower side of the upper pad 370. The connection terminal 380 may include, for example, a solder ball or a solder bump.

The lower pad 390 and the connection terminal 380 constituting the inter-chip connection structure 399 may be surrounded or at least partially surrounded by a third molding layer 230. The third molding layer 230 may include a non-conductive film (NCF) or an underfill. When the connection terminal 380 contacts the upper pad 370 of the lower semiconductor chip 100, the lower semiconductor chip 100 and the upper semiconductor chip 200 may be electrically connected to each other.

In FIG. 3A, in accordance with example embodiments of the present disclosure, the first redistribution line 320 may be impregnated in the first passivation layer 310, whereas a related art first redistribution line may be formed on a passivation layer.

Comparing FIG. 2 and FIG. 3A, there is a difference in the positions where the first redistribution line is disposed. That is, in FIG. 3A, the first redistribution line 320 may be impregnated in the first passivation layer 310, while in FIG. 2, the first redistribution line 72 is formed on the upper surface of the passivation layer 71.

In FIG. 2, the first redistribution line 72 is formed on the upper surface of the passivation layer 71, and the first intermediate insulating layer 73, the second redistribution line 74, and the second intermediate insulating layer 76 are sequentially formed thereon, and thus total thickness of the 2-RDL structure increases and total thickness variation of the 2-RDL structure also increases. The fact that the total thickness of the 2-RDL structure on the lower semiconductor chip 50 increases largely runs counter to the goal of miniaturization of three-dimensional (3D) semiconductor packages. In addition, the fact that the total thickness variation of the 2-RDL structure increases means that the upper pad 77 of FIG. 2 may be arranged at a different vertical levels depending on the position, such that an interface of thermal compression bonding (TCB) between the connection terminal 78 and the upper pad 77 is not constant, which reduces reliability of an inter-chip connection process. That is, when performing a thermal compression bonding process, coupling between the upper pad 77 and the connection terminal 78 may be achieved sufficiently at some positions, but in some other positions, the coupling between the upper pad 77 and the connection terminal 78 may not be achieved or may be achieved insufficiently.

Figure 3B:
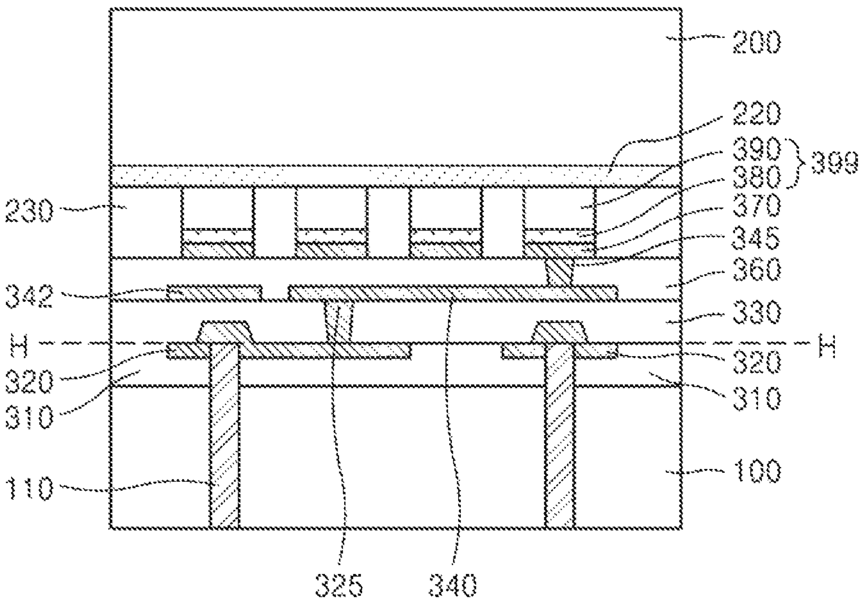
Figure 8A:
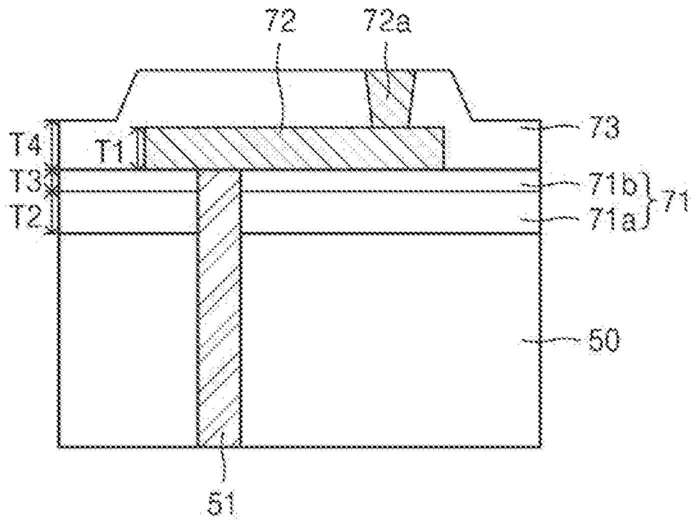
FIG. 8A is cross-sectional view illustrating the vertical thickness of the semiconductor package according to related art.
Figure 8B:
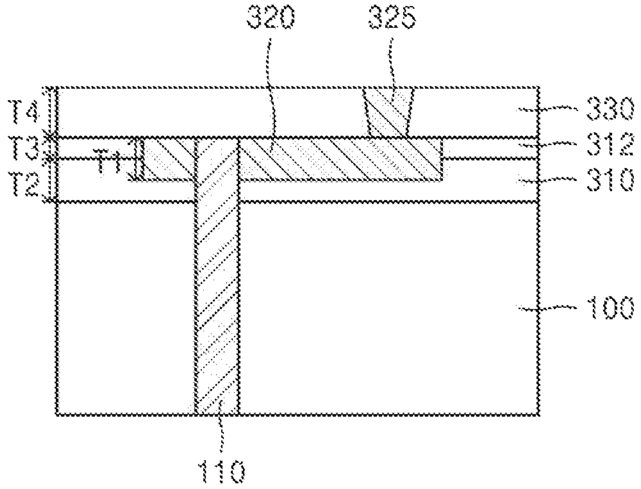
FIG. 8B is cross-sectional view illustrating the vertical thickness of the semiconductor package according to example embodiments of the present disclosure.

The difference in thickness according to the position of the first redistribution lines in FIGS. 2 and 3A will be compared in detail with reference to FIGS. 8A and 8B. FIG. 3B depicts an example of components that may correspond to section "A" of FIG. 1. Repeated descriptions of similar features as those described in the embodiment of FIG. 3A may be omitted.

Unlike FIG. 3A, in the embodiment of FIG. 3B, at least a portion of the first redistribution line 320 may be impregnated in the first passivation layer 310 as shown in FIG. 3A, but at least some others of the first redistribution line 320 may be formed on the first passivation layer 310. Specifically, a portion of the first redistribution line 320 at a position connected to the first intermediate via 325 may be impregnated into the first passivation layer 310, but another portion of the first redistribution line 320 at a position not connected to the first intermediate via 325 (e.g., at the position around the upper end of the TSV structure 110) may be formed on an exposed interface H of the upper end of the TSV structure 110.

Only a dummy redistribution line 342, which may be formed in the same vertical level as the second redistribution line 340 and insulated from surrounding conductive lines, may be formed over the upper end of the TSV structure 110, such that even if the thickness of the first intermediate insulating layer 330 is lowered, the insulating characteristics of the semiconductor package may not greatly affected. Therefore, as described above with reference to FIG. 8B, the total thickness vertically from the upper surface of the lower semiconductor chip 100 to the upper surface of the first intermediate via 325 at the position where the first intermediate via 325 is formed, may be lowered the same as in the case of FIG. 3A. Therefore, in the case of the semiconductor package according to example embodiments of the present disclosure, even though the 2-RDL structure is applied, the height of the semiconductor package may decrease, which may contribute to the miniaturization of the semiconductor package.

Figure 3C:
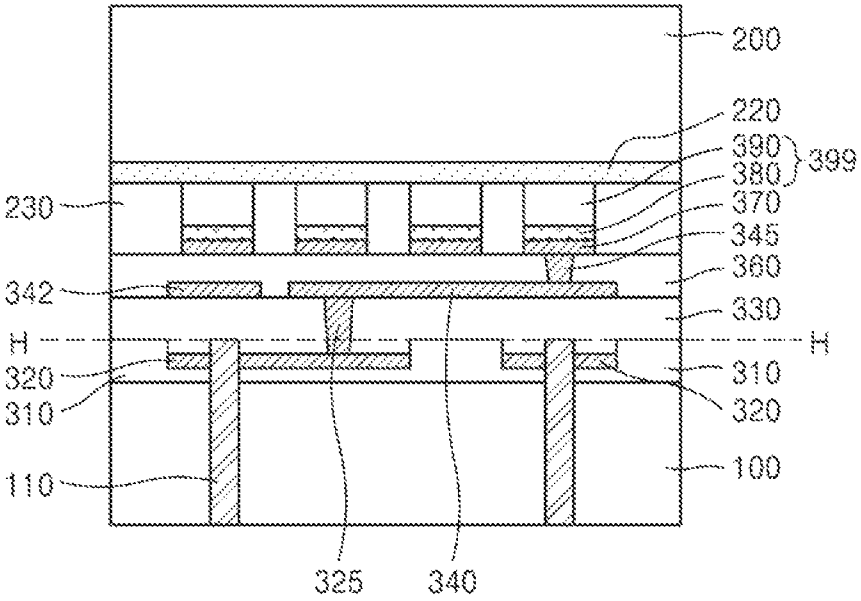

FIG. 3C depicts an example of components that may correspond to section "A" of FIG. 1. Repeated descriptions of similar features as those described in the embodiment of FIG. 3A may be omitted.

Unlike FIG. 3A, in the embodiment of FIG. 3C, all of the first redistribution line 320 may be completely impregnated within the first passivation layer 310. Specifically, not only the lower surface of the first redistribution line 320, but also the upper surface thereof may be formed to be positioned below the exposed interface H of the upper end of the TSV structure 110 (i.e., below a horizontal plane coincident with the upper surface of the first passivation layer 310).

Therefore, as is described with reference to FIG. 8B, the total thickness vertically from the upper surface of the lower semiconductor chip 100 to the upper surface of the first intermediate via 325 at the position where the first intermediate via 325 is formed, may be lowered the same as in the case of FIG. 3A. In the embodiment of FIG. 3C, the thickness of the first intermediate insulating layer 330 may decrease as much as the depth of the upper surface of the first redistribution line 320 impregnated below the exposed interface H. Therefore, in the case of the semiconductor package according to example embodiments of the present disclosure, even though the 2-RDL structure is applied, the height of the semiconductor package may further decrease, which may contribute to the miniaturization of the semiconductor package.

Figure 3D:
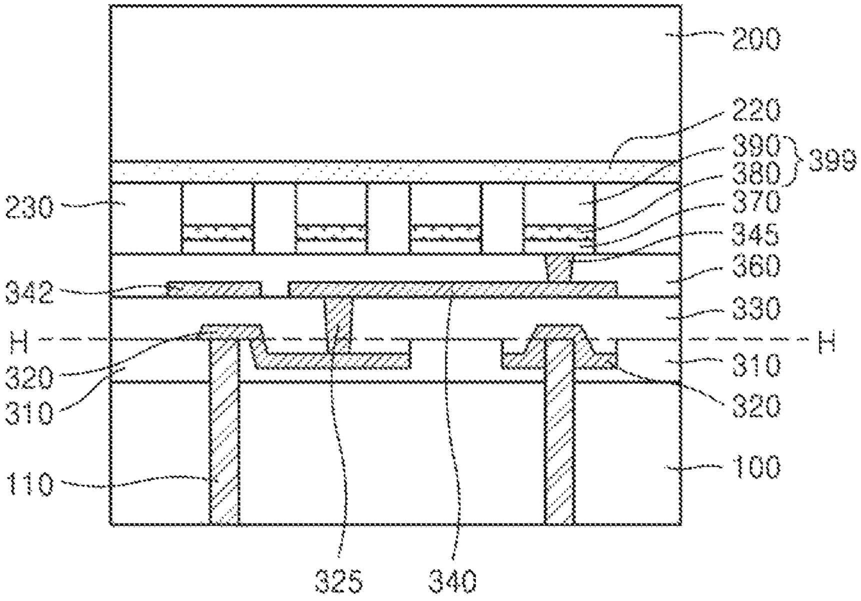

FIG. 3D depicts an example of components that may correspond to section "A" of FIG. 1. Repeated descriptions of similar features as those described in the embodiment of FIG. 3A may be omitted.

The embodiment of FIG. 3D may be an embodiment in which parts of the embodiment of FIG. 3B and the embodiment of FIG. 3C are combined. At least a portion of the first redistribution line 320 may be formed on the exposed interface H around and at the upper end of the TSV structure 110 in which the first redistribution line 320 is not connected to the first intermediate via 325, but at least another portion of the first redistribution line 320 may be formed below the exposed interface H at the position where the first redistribution line 320 is connected to the first intermediate via 325, in which both the lower surface and the upper surface of the first redistribution line 320 may be disposed below the exposed interface H.

Therefore, as described with reference to FIG. 8B, the total thickness vertically from the upper surface of the lower semiconductor chip 100 to the upper surface of the first intermediate via 325 at the position where the first intermediate via 325 is formed, may be lowered the same as in the case of FIG. 3A. In the embodiment of FIG. 3D, the thickness of the first intermediate insulating layer 330 may decrease as much as the depth of the upper surface of the first redistribution line 320 impregnated below the exposed interface H. Therefore, in the case of the semiconductor package according to example embodiments of the present disclosure, even though the 2-RDL structure is applied, the height of the semiconductor package may further decrease, which may contribute to the miniaturization of the semiconductor package.

Figure 4:
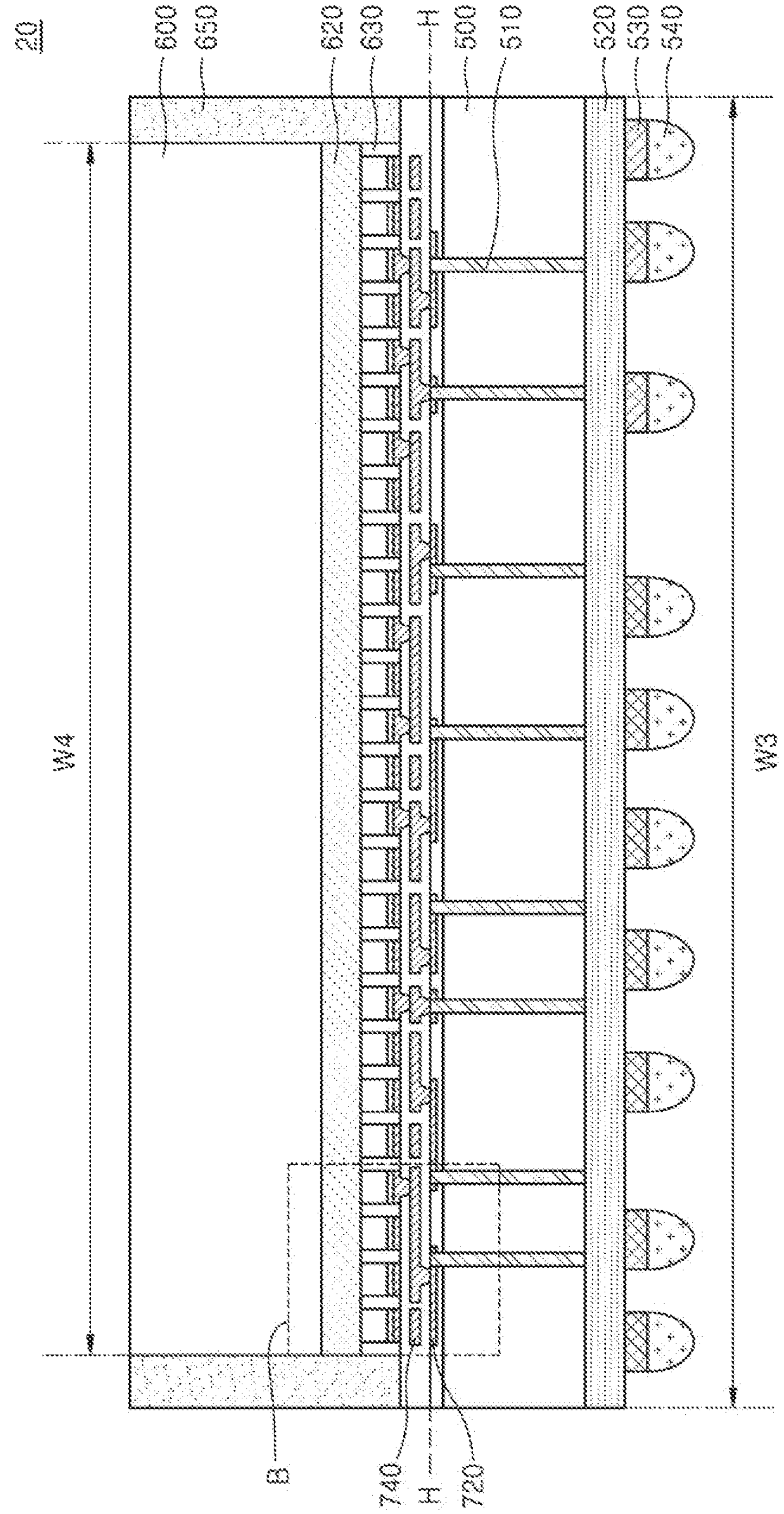
FIG. 4 is a cross-sectional view of a semiconductor package according to example embodiments of the present disclosure.
Figure 5:
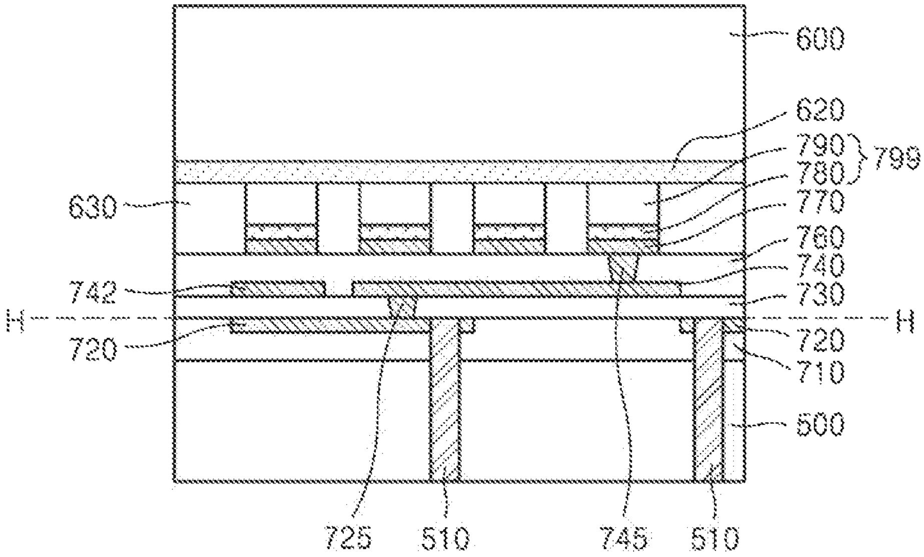
FIG. 5 is a cross-sectional view of a semiconductor package corresponding to section B of FIG. 4 according to example embodiments of the present disclosure.

FIG. 4 is a cross-sectional view of a semiconductor package according to example embodiments of the present disclosure. FIG. 5 is a cross-sectional view of a semiconductor package corresponding to section B of FIG. 4 according to example embodiments of the present disclosure. Repeated descriptions of features similar to those of FIGS. 1-3D may be omitted.

Referring to FIGS. 4 and 5, the semiconductor package 20 may have a lower semiconductor chip 500 and an upper semiconductor chip 600 vertically stacked, and the semiconductor package 20 may have a “Small Top” shape, in which the horizontal area (e.g., a horizontal width, a cross-sectional area or an area in a cross-sectional view) of the lower semiconductor chip 500 is greater than that of the upper semiconductor chip 600. Specifically, the lower semiconductor chip 500 may be disposed at a lower side of the upper semiconductor chip 600, and the horizontal area (e.g., horizontal width, a cross-sectional area or an area in a cross-sectional view) of the lower semiconductor chip 500 may be greater than that of the upper semiconductor chip 600. For example, the width W3 of the lower semiconductor chip 500 may be greater than the width W4 of the upper semiconductor chip 600.

In FIG. 5, the lower semiconductor chip 500 is schematically shown, but the lower semiconductor chip 500 may include a lower semiconductor substrate having an active surface and an inactive surface opposite to each other, and lower semiconductor devices formed on the active surface of the lower semiconductor substrate. The inactive surface of the lower semiconductor substrate may be an upper surface of the lower semiconductor chip 500. The lower semiconductor device including a plurality of individual devices may be formed on the active surface of the lower semiconductor substrate.

In some embodiments, the lower semiconductor device may be a memory semiconductor device, and the lower semiconductor chip 500 may be a memory semiconductor chip. For example, the lower semiconductor device may be a DRAM device, and the lower semiconductor chip 500 may be a DRAM chip. In other embodiments, the lower semiconductor chip 500 may be a logic chip.

The lower BEOL layer 520 may be disposed at a lower side of the lower semiconductor chip 500. The lower BEOL layer 520 may include interconnection lines and interconnection vias, which are conductive lines between the active surface of the lower semiconductor substrate and the lower surface of the lower semiconductor chip 500, and an inter-interconnection insulating layer surrounding or at least partially surrounding the interconnection lines and interconnection vias.

In a lower side of the lower BEOL layer 520, a plurality of lower pads 530 of the lower semiconductor chip 500 that are electrically connected to the conductive lines in the lower BEOL layer 520 may be disposed. A connection terminal 540 may be attached to the lower pad 530. The connection terminal 540 may include a solder ball or a solder bump to be electrically connected to the outside of the semiconductor package.

On the other hand, a TSV structure 510 may be formed in the lower semiconductor chip 500. A plurality of TSV structures 510 may be provided. The TSV structure 510 may vertically penetrate the lower semiconductor chip 500, and an upper end of the TSV structure 510 may extend to protrude into a passivation layer 710 (see FIG. 5) that is formed on the upper surface of the lower semiconductor chip 500, and a lower end of the TSV structure 510 may be electrically connected to a conductive line included in the lower BEOL layer 520.

Although the upper semiconductor chip 600 is schematically shown in FIG. 4, the upper semiconductor chip 600 may include an upper semiconductor substrate having an active surface and an inactive surface opposite to each other, and upper semiconductor devices formed on the active surface of the upper semiconductor substrate. The inactive surface of the upper semiconductor substrate may be an upper surface of the upper semiconductor chip 600.

The upper semiconductor substrate and the upper semiconductor devices constituting the upper semiconductor chip 600 may be configured to be the same as to or similar to the lower semiconductor substrate and the lower semiconductor devices constituting the lower semiconductor chip 500. The upper semiconductor device may further include a conductive interconnection or a conductive plug that electrically connects at least two of a plurality of individual devices, or connects at least one of the plurality of individual devices to a conductive region of the lower semiconductor substrate. In some embodiments, the upper semiconductor device may be a memory semiconductor device, and the upper semiconductor chip 600 may be a memory semiconductor chip. For example, the upper semiconductor device may be a DRAM device, and the upper semiconductor chip 600 may be a DRAM chip. In other embodiments, the upper semiconductor chip 600 may be a logic chip.

An upper BEOL layer 620 may be disposed at a lower side of the upper semiconductor chip 600. The upper BEOL layer 620 may include interconnection lines and interconnection vias, which constitute conductive lines between the active surface of the upper semiconductor substrate and a lower surface of the upper semiconductor chip 600, and an inter-interconnection surrounding or at least partially surrounding the interconnection lines and interconnection vias.

On the other hand, in order to electrically connect the lower semiconductor chip 500 and the upper semiconductor chip 600, a first redistribution line 720 and a second redistribution line 740 may be formed on the upper side of the lower semiconductor chip 500, and an inter-chip connection structure 799 for connecting the second redistribution line 740 to the conductive line of the upper BEOL layer 620 may be disposed.

FIG. 5 shows an example in which a 2-RDL structure may be provided on the upper surface of the lower semiconductor chip 500 to accommodate the customer's request for improvement in design freedom in a backside process of the lower semiconductor chip 500. A first passivation layer 710 may be formed on the upper surface of the lower semiconductor chip 500 at a predetermined thickness. The first passivation layer 710 may be formed as an insulating material to insulate the first redistribution line 720 disposed thereon from the upper surface of the lower semiconductor chip 500 while protecting the upper surface of the lower semiconductor chip 500.

In FIG. 5, for the convenience of description, an embodiment in which the first passivation layer 710 is made of a single layer is shown, but in other embodiments, a plurality of insulating material layers such as a second passivation layer 312 (see FIGS. 7C to 7M, and 8B) may be further formed on the first passivation layer 710.

On the other hand, the TSV structure 510 penetrating the lower semiconductor chip 500 may extend while protruding into the first passivation layer 710 to a predetermined height. The first redistribution line 720 may be impregnated in the first passivation layer 710. In the embodiment of FIG. 5, the first redistribution line 720 may be formed to be impregnated in the first passivation layer 710 such that an upper surface of the first redistribution line 720 is vertically coplanar with an exposed interface H of the upper end of the TSV structure 110.

A first intermediate insulating layer 730 may be formed on the first passivation layer 710 and the first redistribution line 720, and a second redistribution line 740 may be formed on the first intermediate insulating layer 730. A second intermediate insulating layer 760 covering the second redistribution line 740 may be formed on the first intermediate insulating layer 730. The first redistribution line 720 may be electrically connected to the second redistribution line 740 through a first intermediate via 725 therebetween. The second redistribution line 740 may be electrically connected to an upper pad 770 of the lower semiconductor chip 500, which may be formed on the second intermediate insulating layer 760, through a second intermediate via 745 formed in the second intermediate insulating layer 760.

Referring again to FIG. 5, the lower semiconductor chip 500 may be electrically connected to the upper semiconductor chip 600 through the inter-chip connection structure 799 therebetween. The inter-chip connection structure 799 may include a lower pad 790 that is formed on a lower surface of the upper BEOL layer 620 and is electrically connected to a conductive line of the upper BEOL layer 620, and a connection terminal 780 connected to a lower side of the upper pad 770. The connection terminal 780 may include, for example, a solder ball or a solder bump.

The lower pad 790 and the connection terminal 780 constituting the inter-chip connection structure 799 may be surrounded or at least partially surrounded by a first molding layer 630. The first molding layer 630 may include an NCF or an underfill. When the connection terminal 780 contacts the upper pad 770 of the lower semiconductor chip 500, the lower semiconductor chip 500 and the upper semiconductor chip 600 may be electrically connected to each other.

Referring again to FIG. 4, a second molding layer 650 surrounding or at least partially surrounding the upper semiconductor chip 600 over the lower semiconductor chip 500 may be formed. The second molding layer 650 may include EMC.

Even in the cases of example embodiments of the present disclosure shown in FIGS. 4 and 5, the specific comparison of the difference in thickness according to the position of the first redistribution line with reference to FIGS. 8A and 8B may be equally applied. In addition, descriptions of the embodiments described with reference to FIGS. 3B to 3D may also be equally applied to the embodiments of FIGS. 4 and 5.

Figure 6A:
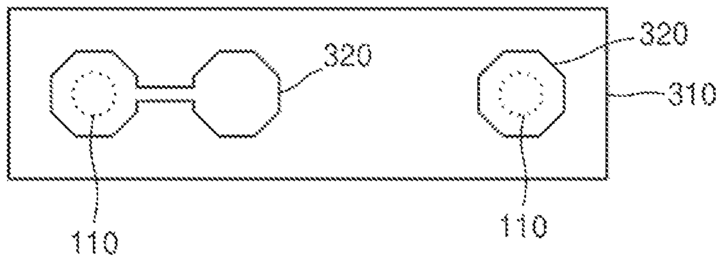
FIG. 6A is a plan view, cut horizontally to show a first redistribution line according to example embodiments of the present disclosure.

FIG. 6A is a plan view, cut horizontally to show a first redistribution line according to example embodiments of the present disclosure. FIG. 6B is a plan view, cut horizontally to show a second redistribution line according to example embodiments of the present disclosure. FIG. 6C is a plan view, cut horizontally to show a pad layer according to example embodiments of the present disclosure.

FIG. 6A is a schematic plan view, cut horizontally to show a first redistribution line 320 in FIG. 3A.

As shown in FIG. 6A, the first redistribution line 320 may have an approximate dumbbell-shaped pattern. A left side of the first redistribution line 320 in the dumbbell-shaped pattern may surround or at least partially surround the TSV structure 110 such that the TSV structure 110 is located substantially in the center, and a right side of the first redistribution line 320 in the dumbbell-shaped pattern may be approximately symmetrical with the left side. In other embodiments, the right and left side of the first redistribution line 320 in the dumbbell-shaped pattern may not be symmetrical. The right side in the dumbbell-shaped pattern may be a portion where the first intermediate via 325 may contact. The left side of the first redistribution line 320 may be connected to the right side thereof through a thin line pattern. Although the line pattern is shown as a straight line, the line pattern may be formed in various patterns according to the design, and also the line width may change in a middle portion without constant. The left and right sides of the first redistribution line 320 are shown as having an approximate octagonal-shaped pattern, but may have a circular or polygonal shape pattern. In addition, the left side and right side of the first redistribution line 320 are shown as having the dumbbell-shape pattern, but may be formed in a rectangular pattern.

Figure 6B:
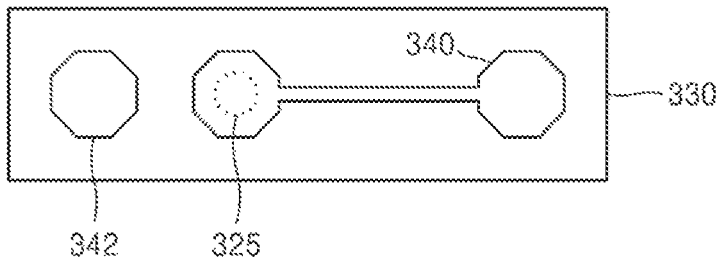
FIG. 6B is a plan view, cut horizontally to show a second redistribution line according to example embodiments of the present disclosure.

FIG. 6B is a schematic plan view, cut horizontally to show a second redistribution line 340 in FIG. 3A. As shown in FIG. 6B, the second redistribution line 340 is shown as having an approximate dumbbell-shape pattern, but may be formed in various patterns without limited thereto. The left side of the second redistribution line 340 in the dumbbell-shape pattern may surround or at least partially surround the first intermediate via 325 such that the first intermediate via 325 is positioned approximately in the center, and the right side of the second redistribution line 340 in the dumbbell-shape pattern may be in a shape similar to the left side of the second redistribution line 340 to form an approximately symmetrical shape, but it is not limited thereto. The second redistribution line 340 may be formed in various ways in the same or different pattern as the first redistribution line 320 described above.

On the other hand, a dummy redistribution line 342 may be formed on the left side of the second redistribution line 340. The dummy redistribution line 342 may be formed of the same material and thickness as the second redistribution line 340. The dummy redistribution line 342 may serve to reduce a thickness deviation according to a position of the second intermediate insulating layer 360 covering the second redistribution line 340.

Figure 6C:
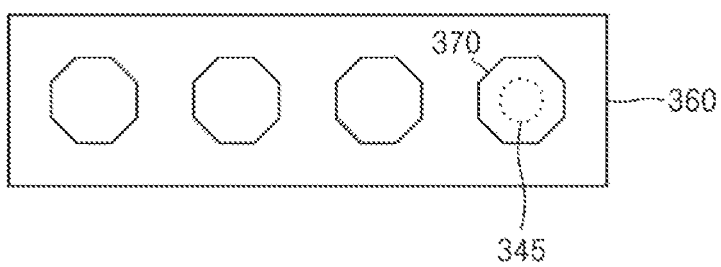
FIG. 6C is a plan view, cut horizontally to show a pad layer according to example embodiments of the present disclosure.

FIG. 6C is a schematic plan view, cut horizontally to show the upper pad 370 in FIG. 3A. As shown in FIG. 6C, the upper pads 370 of the lower semiconductor chip 100 may be individually separated by the second intermediate insulating layer 360. In FIG. 6C, the upper pads 370 are shown in an octagonal-shaped pattern, but may be formed in a circular or polygonal shape pattern. The upper pad 370 may be a portion contacting the second intermediate via 345, and at the same time, as described below, may be a portion contacting an inter-chip connection structure for electrical connection between the lower semiconductor chip 100 and the upper semiconductor chip 200.

Hereinafter, based on the semiconductor package of FIG. 3A, a method of manufacturing a semiconductor package with the 2-RDL structure on the lower semiconductor chip 100 will be described, according to example embodiments of the present disclosure.

FIGS. 7A, 7B, 7C, 7D, 7E, 7F, 7G, 7H, 7I, 7J, 7K, 7L and 7M are cross-sectional views sequentially illustrating a method of manufacturing a semiconductor package according to example embodiments of the present disclosure.

Figure 7A:
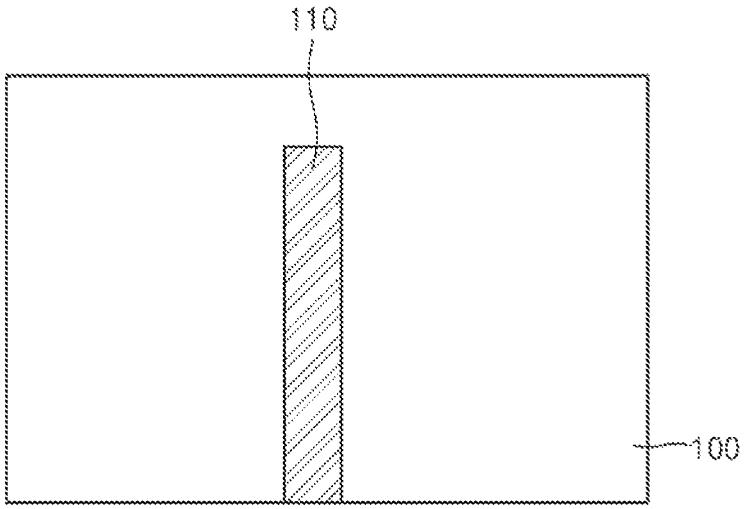
FIGS. 7A, 7B, 7C, 7D, 7E, 7F, 7G, 7H, 7I, 7J, 7K, 7L and 7M are cross-sectional views sequentially illustrating a method of manufacturing a semiconductor package according to example embodiments of the present disclosure.

Referring to FIG. 7A, the TSV structure 110 may be formed to a predetermined depth in the lower semiconductor substrate made of, for example, silicon, constituting the lower semiconductor chip 100.

Figure 7B:
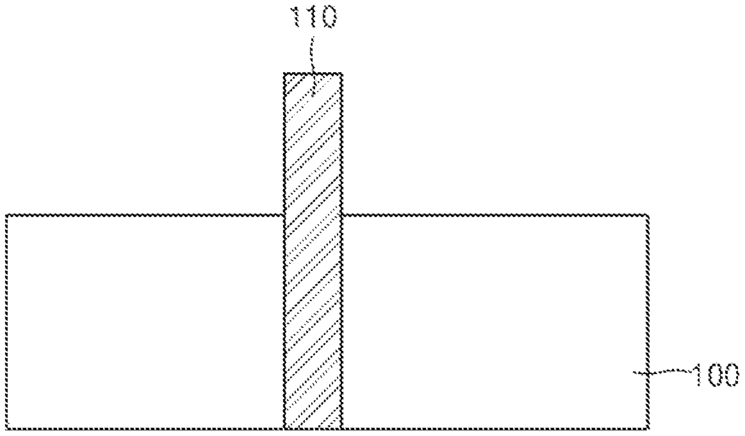

Referring to FIG. 7B, a portion of the lower semiconductor substrate of the lower semiconductor chip 100 may be etched to expose a portion of an upper part of the TSV structure 110. A surface of the lower semiconductor substrate remaining after being etched away may become an inactive surface.

Figure 7C:
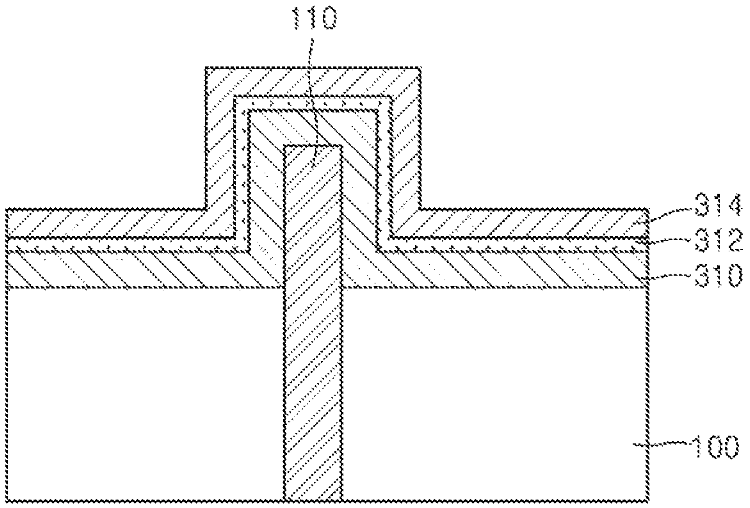

Referring to FIG. 7C, an oxide nitride oxide (ONO) layer may be deposited on the entire surface of the lower semiconductor substrate where the portion of the TSV structure 110 is exposed. The ONO layer may include a first oxide layer 310, a nitride layer 312, and a second oxide layer 314. The first oxide layer 310 may correspond to a first passivation layer, and the nitride layer 312 may correspond to a second passivation layer.

Figure 7D:
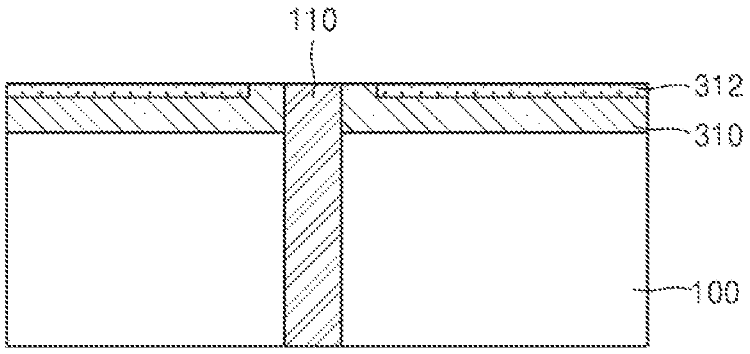

Referring to FIG. 7D, a chemical mechanical polishing (CMP) process may be performed to the entire surface of the lower semiconductor substrate until the nitride layer 312 is exposed to planarize the surface thereof.

Figure 7E:
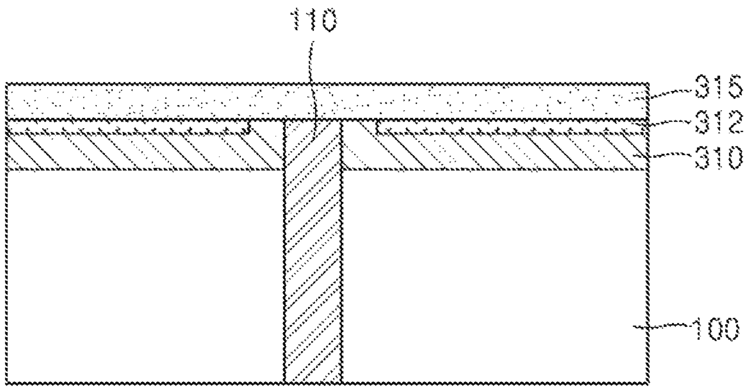

Referring to FIG. 7E, a photoresist layer 315 may be applied to the entire planarized surface of the lower semiconductor substrate. The photoresist layer 315 may be used to form an alignment mark in a scribe lane in the subsequent process.

Figure 7F:
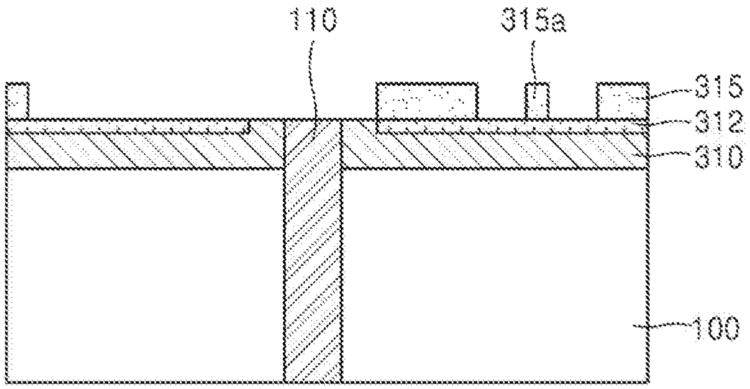
Figure 7G:
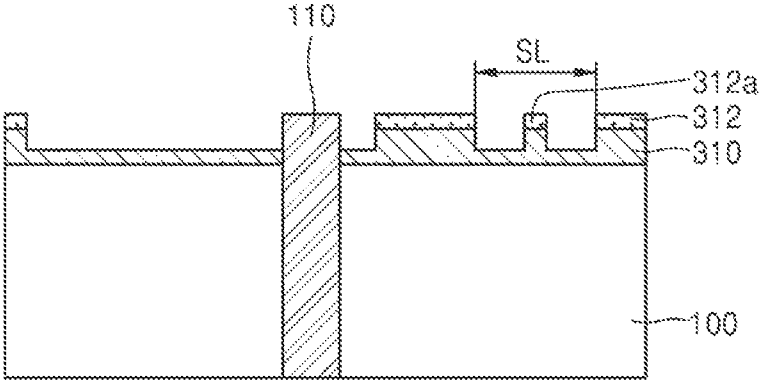

Referring to FIG. 7F, a portion of the photoresist layer 315 may be removed by exposure and development, leaving a photoresist pattern 315*a* for forming the alignment mark within the scribe lane SL (see FIG. 7G). At this time, the photoresist layer 315 on a portion where the first redistribution line 320 is to be formed in FIG. 3A, may also be removed.

Referring to FIG. 7G, using the remaining photoresist pattern 315*a* as an etch mask, a portion of the exposed nitride layer 312 may be removed from a portion where the photoresist pattern 315*a* does not remain, and then the remaining photoresist pattern 315*a* may be removed by ashing treatment. Subsequently, the exposed first oxide layer 310 may be etched and removed by a predetermined depth using a portion of the nitride layer 312 that is not removed as an etch mask. On the other hand, the remaining photoresist pattern 315*a* may be continuously used as an etch mask without being removed, such that a portion of the first oxide layer 310 exposed after the nitride layer 312 is removed may be etched and then removed. As a result, the scribe lane SL may be formed, and an alignment mark 312*a* may be formed in the scribe lane SL. At the same time, the first oxide layer 310 may remain in a portion where the first redistribution line 310 surrounding or at least partially surrounding the TSV structure 110 is to be formed. Accordingly, a process of forming the first redistribution line 320 may be performed simultaneously with a process of forming the alignment mark 312*a* without a separate additional process.

Figure 7H:
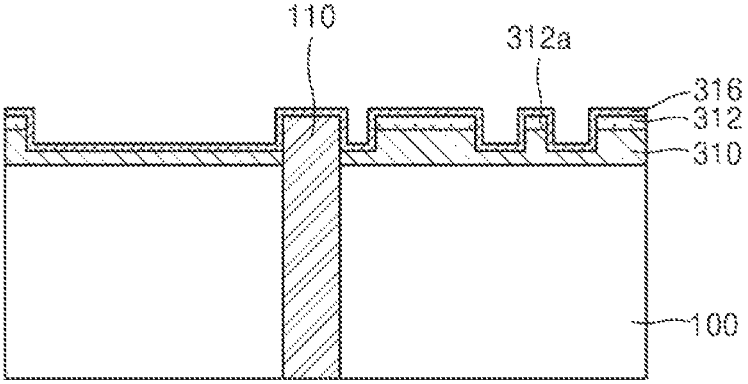

Referring to FIG. 7H, a seed metal layer 316 for forming the first redistribution line 320 may be formed on the entire surface of the lower semiconductor substrate. The seed metal layer 316 may include copper, for example.

Figure 7I:
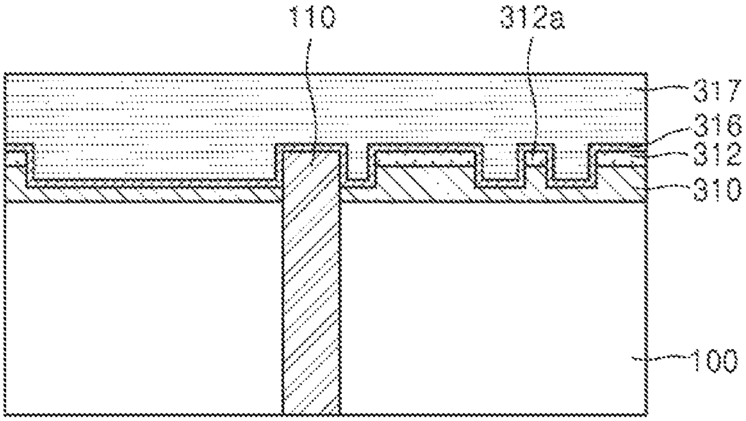

Referring to FIG. 7I, a photoresist layer 317 for forming the first redistribution line 320 may be applied to the entire surface of the lower semiconductor substrate.

Figure 7J:
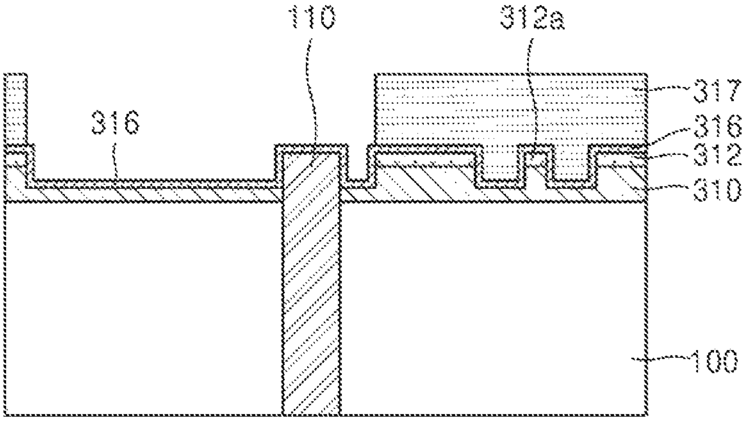

Referring to FIG. 7J, a portion of the photoresist layer 317 may be removed by exposure and development to define the portion where the first redistribution line 320 is to be formed. At this time, the scribe lane SL may not be exposed. The seed metal layer 316 may remain in the portion where the photoresist layer 317 is removed.

Figure 7K:
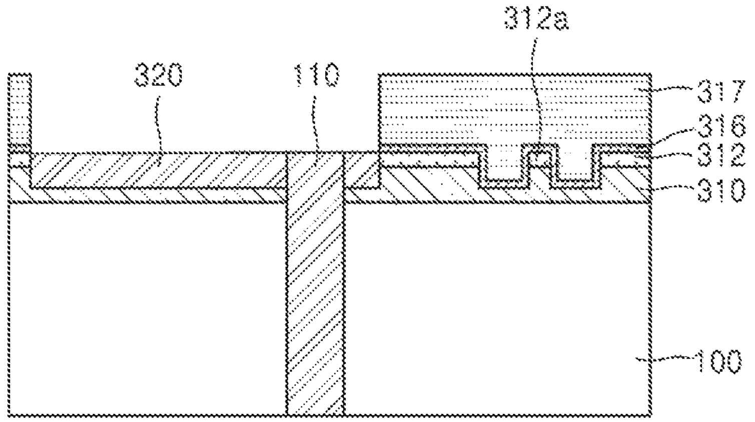

Referring to FIG. 7K, electroplating may be performed on the entire surface of the lower semiconductor substrate. Accordingly, the first redistribution line 320 may be formed in the portion where the first redistribution line 320 is to be formed, in which the seed metal layer 316 remains.

Figure 7L:
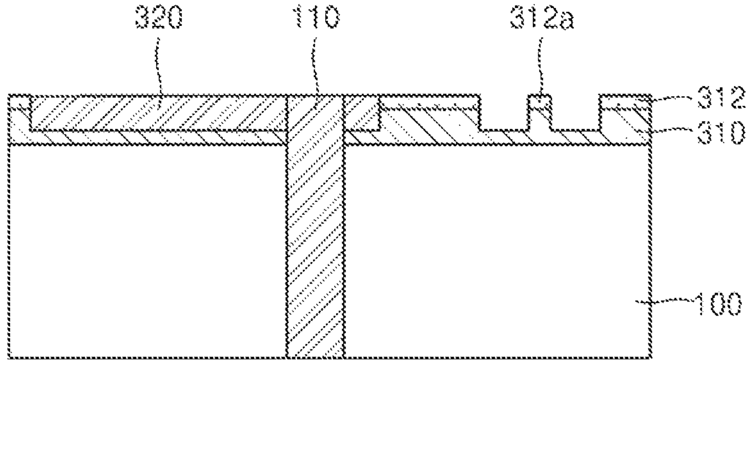

Referring to FIG. 7L, the remaining photoresist layer 317 may be removed by ashing treatment. As a result, the first redistribution line 320 may be formed around an upper portion of the TSV structure 110, and the alignment mark 312*a* may remain in the scribe lane SL.

Figure 7M:
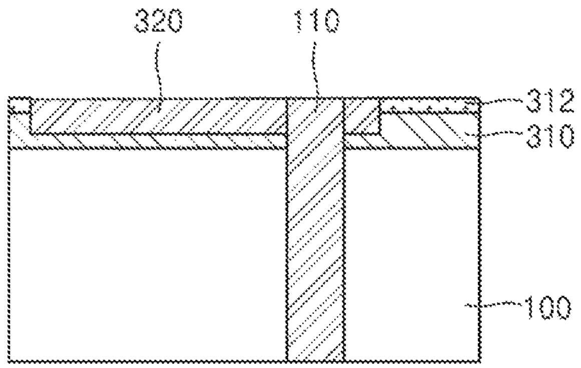

FIG. 7M shows a cross-sectional view after the scribe lane SL is removed by a subsequent process.

FIG. 8A is cross-sectional view illustrating the vertical thickness of the semiconductor package according to related art. FIG. 8B is cross-sectional view illustrating the vertical thickness of the semiconductor package according to example embodiments of the present disclosure. In particular, FIGS. 8A and 8B are partial cross-sectional views for comparing the vertical height of the semiconductor package according to the position of the first redistribution line in FIGS. 2 and 3A, respectively. In FIGS. 8A and 8B, a case in which two passivation layers are formed will be described.

Referring to FIG. 8A, the first redistribution line 72 is formed on the upper surface of the passivation layer 71. The passivation layer 71 includes a first passivation layer 71*a* (e.g., oxide) and a second passivation layer 71*b* (e.g., nitride). A thickness of the first redistribution line 72 is 'T1', the thickness of the first passivation layer 71*a* is 'T2', the thickness of the second passivation layer 71*b* is 'T3', and the thickness of the first intermediate insulating layer 73 is 'T4'. Therefore, at the position where the first intermediate via 72*a* connected to the second redistribution line 74 is formed (see FIG. 2), the total thickness vertically from an upper surface of the lower semiconductor chip 50 to an upper surface of the first intermediate via 72*a* is T2+T3+T1+T4.

Referring to FIG. 8B, the first redistribution line 320 may be formed below an upper surface of a passivation layer. The passivation layer may include a first passivation layer 310 (e.g., oxide) and a second passivation layer 312 (e.g., nitride). The thickness of the first redistribution line 320 may be 'T1', the thickness of the first passivation layer 310 may be 'T2', the thickness of the second passivation layer 312 may be 'T3', and the thickness of the first intermediate insulating layer 330 may be 'T4'. Therefore, at the position where the first intermediate via 325 connected to the second redistribution line 340 is formed (see FIG. 3A), the total thickness vertically from the upper surface of the lower semiconductor chip 100 to the upper surface of the first intermediate via 325 may be T2+T3+T4.

Assuming that in FIGS. 8A and 8B, the thickness T2 of the first passivation layer, the thickness T3 of the second passivation layer, the thickness T1 of the first redistribution line, and the thickness T4 of the first intermediate insulating layer are the same as each other, respectively, the total thickness vertically from the upper surface of the lower semiconductor chip 100 to the upper surface of the first intermediate via 325 at the position where the first intermediate via 325 is formed may be lowered by the thickness T1 compared to the corresponding total thickness in the case of FIG. 8A. Therefore, in the case of the semiconductor package according to example embodiments of the present disclosure, even though the 2-RDL structure is applied, the height of the semiconductor package may decrease, which may contribute to the miniaturization of the semiconductor package. That is, the first redistribution line 320 may be impregnated in the passivation layer, such that even if the 2-RDL structure is applied, the height of the semiconductor package may decrease substantially similar to the case of applying an 1-RDL structure.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor package comprising:

a package-bottom redistribution structure at a lower side of a package and comprising a conductive line;

an upper semiconductor chip at an upper side of the package;

an upper back end of line (BEOL) layer, at a lower side of the upper semiconductor chip, comprising a conductive line;

a lower semiconductor chip below the upper semiconductor chip, wherein a horizontal width of the lower semiconductor chip is less than a horizontal width of the upper semiconductor chip, and wherein at least a portion of the upper semiconductor chip overlaps the lower semiconductor chip;

a lower BEOL layer at a lower side of the lower semiconductor chip and comprising a conductive line;

a passivation layer on an upper surface of the lower semiconductor chip;

a through silicon via (TSV) structure penetrating the passivation layer and the lower semiconductor chip, the TSV structure being connected to the conductive line of the lower BEOL layer;

a first redistribution line connected to the TSV structure, wherein at least a portion of the first redistribution line is impregnated in the passivation layer;

a second redistribution line above the first redistribution line and connected to the first redistribution line through an intermediate via;

a first intermediate insulating layer on the passivation layer, separating the first redistribution line from the second redistribution line and at least partially surrounding the intermediate via;

a second intermediate insulating layer on the first intermediate insulating layer and at least partially surrounding the second redistribution line;

an inter-chip connection structure between the second intermediate insulating layer and the upper BEOL layer, the inter-chip connection structure connecting the conductive line of the upper BEOL layer and the second redistribution line;

a first post connecting the conductive line of the lower BEOL layer and the conductive line of the package-bottom redistribution structure;

a second post connecting the conductive line of the upper BEOL layer and the conductive line of the package-bottom redistribution structure;

a first molding layer between the lower BEOL layer and the package-bottom redistribution structure, the first molding layer at least partially surrounding the first post; and a second molding layer between the upper BEOL layer and the package-bottom redistribution structure, the second molding layer at least partially surrounding the second post.

2. The semiconductor package of claim 1, wherein the TSV structure comprises an exposed interface on an upper end thereof, and wherein at least a portion of an upper surface of the first redistribution line is not above the exposed interface of the upper end of the TSV structure.

3. The semiconductor package of claim 2, wherein the intermediate via is on the at least a portion of the upper surface of the first redistribution line that is not vertically above the exposed interface of the upper end of the TSV structure.

4. The semiconductor package of claim 2, wherein a lower surface of the first redistribution line is below the exposed interface of the upper end of the TSV structure.

5. The semiconductor package of claim 2, wherein at least another portion of the upper surface of the first redistribution line is vertically above the exposed interface of the upper end of the TSV structure.

6. The semiconductor package of claim 1, wherein a portion of the TSV structure extends into the passivation layer, and wherein the portion of the TSV structure that extends into the passivation layer is at least partially surrounded while contacting the first redistribution line.

7. The semiconductor package of claim 1, further comprising a dummy redistribution line comprising a material that is substantially the same as a material the second redistribution line, and wherein the dummy redistribution line is horizontally at a level as that is substantially the same as a level the second redistribution line.

8. A semiconductor package comprising:

a semiconductor chip;

a back end of line (BEOL) layer, at a lower side of the semiconductor chip, comprising a conductive line;

a passivation layer on an upper surface of the semiconductor chip;

a through silicon via (TSV) structure penetrating the passivation layer and the semiconductor chip, the TSV structure being electrically connected to the conductive line of the BEOL layer;

a first redistribution line connected to the TSV structure, wherein at least a portion of the first redistribution line is impregnated in the passivation layer;

a second redistribution line above the first redistribution line and connected to the first redistribution line through an intermediate via;

a first intermediate insulating layer on the passivation layer, separating the first redistribution line from the second redistribution line and at least partially surrounding the intermediate via; and a second intermediate insulating layer on the first intermediate insulating layer and at least partially surrounding the second redistribution line.

9. The semiconductor package of claim 8, wherein the TSV structure comprises an exposed interface on an upper end thereof, and wherein at least a portion of an upper surface of the first redistribution line is not above the exposed interface of the upper end of the TSV structure.

10. The semiconductor package of claim 9, wherein the intermediate is on the at least a portion of the upper surface of the first redistribution line that is not above the exposed interface of the upper end of the TSV structure.

11. The semiconductor package of claim 9, wherein a lower surface of the first redistribution line is below the exposed interface of the upper end of the TSV structure.

12. The semiconductor package of claim 9, wherein at least another portion of the upper surface of the first redistribution line is above the exposed interface of the upper end of the TSV structure.

13. The semiconductor package of claim 8, wherein a portion of the TSV structure extends into the passivation layer, and wherein the portion of the TSV structure that extends into the passivation layer is at least partially surrounded while contacting the first redistribution line.

* * * * *